(12) United States Patent
Lee et al.

(10) Patent No.: US 6,890,850 B2
(45) Date of Patent: May 10, 2005

(54) METHOD OF DEPOSITING DIELECTRIC MATERIALS IN DAMASCENE APPLICATIONS

(75) Inventors: Ju-Hyung Lee, San Jose, CA (US); Ping Xu, Fremont, CA (US); Shankar Venkataraman, Santa Clara, CA (US); Li-Qun Xia, Santa Clara, CA (US); Fei Han, San Jose, CA (US); Ellie Yieh, San Jose, CA (US); Srinivas D. Nemani, San Jose, CA (US); Kangsub Yim, Mountain View, CA (US); Farhad K. Moghadam, Saratoga, CA (US); Ashok K. Sinha, Palo Alto, CA (US); Yi Zheng, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 194 days.

(21) Appl. No.: 10/196,498

(22) Filed: Jul. 15, 2002

(65) Prior Publication Data

US 2003/0129827 A1 Jul. 10, 2003

Related U.S. Application Data

(60) Provisional application No. 60/340,615, filed on Dec. 14, 2001.

(51) Int. Cl.[7] ..................... H01L 21/4763; H01L 21/31; H01L 21/469
(52) U.S. Cl. ..................... 438/631; 438/634; 438/638; 438/789
(58) Field of Search ..................... 438/631, 634, 438/638, 789

(56) References Cited

U.S. PATENT DOCUMENTS

| | | |
|---|---|---|
| 4,532,150 A | 7/1985 | Endo et al. |
| 4,649,071 A | 3/1987 | Tajima et al. ............... 428/212 |
| 4,981,724 A | 1/1991 | Hochberg et al. ....... 427/255.37 |
| 5,000,113 A | 3/1991 | Wang et al. ............... 118/23 E |
| 5,000,178 A | 3/1991 | Griffith .......................... 607/2 |

(Continued)

FOREIGN PATENT DOCUMENTS

| | | | |
|---|---|---|---|
| DE | 196 54 737 | 7/1997 | |
| EP | 1 176 226 A1 | 1/2002 | ........... C23C/16/32 |
| EP | 1 354 980 A1 | 10/2003 | |
| JP | 9-237785 | 7/1997 | |
| WO | WO 99/21706 A1 | 5/1999 | |
| WO | WO 99/41423 A2 | 8/1999 | |
| WO | 00/19498 | 4/2000 | ......... H01L/21/027 |

OTHER PUBLICATIONS

"Oligomerization and Polymerization Steps in Remote Plasma Chemical Vapor Deposition of Silicon–Carbon and Silica Films from Organosilicon Sources", Chemical Material, 2001, 13, p. 1884–1895, May, 2001.*

(Continued)

Primary Examiner—William M. Brewster
(74) Attorney, Agent, or Firm—Moser, Patterson & Sheridan (57) ABSTRACT

Methods are provided for depositing an oxygen-doped dielectric layer. The oxygen-doped dielectric layer may be used for a barrier layer or a hardmask. In one aspect, a method is provided for processing a substrate including positioning the substrate in a processing chamber, introducing a processing gas comprising an oxygen-containing organosilicon compound, carbon dioxide, or combinations thereof, and an oxygen-free organosilicon compound to the processing chamber, and reacting the processing gas to deposit an oxygen-doped dielectric material on the substrate, wherein the dielectric material has an oxygen content of about 15 atomic percent or less. The oxygen-doped dielectric material may be used as a barrier layer in damascene or dual damascene applications.

27 Claims, 6 Drawing Sheets

U.S. PATENT DOCUMENTS

| | | | |
|---|---|---|---|
| 5,298,587 A | 3/1994 | Hu et al. | 528/10 |
| 5,298,597 A | 3/1994 | Yuo et al. | 528/336 |
| 5,362,526 A | 11/1994 | Wang et al. | 427/573 |
| 5,494,712 A | 2/1996 | Hu et al. | 427/489 |
| 5,554,570 A | 9/1996 | Maeda et al. | 438/763 |
| 5,638,251 A | 6/1997 | Goel et al. | 361/313 |
| 5,926,740 A | 7/1999 | Forbes et al. | 438/763 |
| 5,976,979 A | 11/1999 | Chen | 438/691 |
| 6,045,877 A | 4/2000 | Gleason et al. | 427/522 |
| 6,051,321 A | 4/2000 | Lee et al. | 428/447 |
| 6,054,379 A | 4/2000 | Yau et al. | 438/623 |
| 6,068,884 A | 5/2000 | Rose et al. | 427/255.6 |
| 6,072,227 A | 6/2000 | Yau et al. | 257/642 |
| 6,080,526 A | 6/2000 | Yang et al. | 430/296 |
| 6,124,641 A | 9/2000 | Matsuura | 257/759 |
| 6,140,226 A | 10/2000 | Grill et al. | 438/637 |
| 6,147,009 A | 11/2000 | Grill et al. | 438/780 |
| 6,153,537 A | 11/2000 | Bacchetta et al. | 438/763 |
| 6,159,871 A | 12/2000 | Loboda et al. | 438/736 |
| 6,287,990 B1 | 9/2001 | Cheung et al. | 438/780 |
| 6,303,523 B2 | 10/2001 | Cheung et al. | 438/780 |
| 6,312,793 B1 | 11/2001 | Grill et al. | 428/312.6 |
| 6,316,167 B1 | 11/2001 | Angelopoulos et al. | 430/313 |
| 6,331,494 B1 | 12/2001 | Olson et al. | 438/770 |
| 6,340,628 B1 | 1/2002 | Van Cleemput et al. | 438/586 |
| 6,410,463 B1 | 6/2002 | Matsuki | 438/790 |
| 6,437,443 B1 | 8/2002 | Grill et al. | 257/758 |
| 6,441,491 B1 | 8/2002 | Grill et al. | 257/759 |
| 6,455,445 B2 | 9/2002 | Matsuki | 438/799 |
| 6,479,110 B2 | 11/2002 | Grill et al. | 427/577 |
| 6,479,409 B2 | 11/2002 | Shioya et al. | 438/790 |
| 6,486,082 B1 | 11/2002 | Cho et al. | 438/789 |
| 6,500,773 B1 | 12/2002 | Gaillard et al. | 438/790 |
| 6,531,714 B1 | 3/2003 | Bacchetta et al. | 257/77 |
| 6,537,929 B1 | 3/2003 | Cheung et al. | 438/790 |
| 6,541,398 B2 | 4/2003 | Grill et al. | 438/780 |
| 6,548,899 B2 | 4/2003 | Ross | 257/750 |
| 6,559,520 B2 | 5/2003 | Matsuki et al. | 257/642 |
| 6,562,690 B1 | 5/2003 | Cheung et al. | 438/400 |
| 6,582,777 B1 | 6/2003 | Ross et al. | 427/551 |
| 6,583,048 B1 | 6/2003 | Vincent et al. | 438/623 |
| 6,583,071 B1 | 6/2003 | Weidman et al. | 438/787 |
| 6,596,655 B1 | 7/2003 | Cheung et al. | 438/789 |
| 6,624,053 B2 * | 9/2003 | Passemard | 438/584 |
| 6,642,157 B2 | 11/2003 | Shioya et al. | 438/789 |
| 6,656,837 B2 * | 12/2003 | Xu et al. | 438/676 |
| 6,660,391 B1 | 12/2003 | Rose et al. | 428/446 |
| 6,734,115 B2 | 5/2004 | Cheung et al. | 438/789 |
| 6,756,323 B2 | 6/2004 | Grill et al. | 438/780 |
| 6,759,327 B2 * | 7/2004 | Xia et al. | 438/643 |
| 6,770,573 B2 | 8/2004 | Grill et al. | 438/778 |
| 6,790,789 B2 | 9/2004 | Grill et al. | 438/778 |
| 2001/0005546 A1 | 6/2001 | Cheung et al. | 428/210 |
| 2002/0098714 A1 | 7/2002 | Grill et al. | 438/778 |
| 2003/0003765 A1 | 1/2003 | Gibson, Jr. et al. | 438/760 |
| 2003/0042605 A1 * | 3/2003 | Andideh et al. | 257/741 |
| 2003/0089988 A1 | 5/2003 | Matsuura | 257/758 |
| 2003/0111730 A1 | 6/2003 | Takeda et al. | 257/758 |
| 2003/0139062 A1 | 7/2003 | Grill et al. | 438/778 |
| 2003/0194495 A1 | 10/2003 | Li et al. | 427/255.28 |
| 2003/0198742 A1 | 10/2003 | Vrtis | 427/255.28 |
| 2003/0211244 A1 | 11/2003 | Li et al. | 427/255.28 |

OTHER PUBLICATIONS

PCT/International Search Report for US/02/40034 dated May 19, 2003.

Wu, et al "Advanced Metal Barrier Free Cu Damascene Interconnects with PECVD Silicon Carbide Barriers for 90/65–nm BEOL Technology", 2002 IEEE, IEDM pp. 595–598.

Gaillard, et al., "Method of Decreasing the K Value in SIOC Layer Deposited by Chemical Vapor Deposition," Oct. 5, 2000, USSN 09/679,843.

Nemani, et al., "Dual Frequency Plasma Enhanced Chemical Vapor Deposition of Silicon Carbide Layers,"Sept. 12, 2000, USSN 09/660,268.

Tajima, et al. "Characterization of Plasma Polymers from Tetramethysilane, Octamethylcyclotetrasiloxane, and Methyltrimethoxysilane" Journal of Polymer Science: Part A: Polymer Chemistry, vol. 25 (1987) pp. 1737–1744.

* cited by examiner

METHOD OF DEPOSITING DIELECTRIC MATERIALS IN DAMASCENE APPLICATIONS

CROSS-REFERENCE TO RELATED APPLICATIONS

This application claims benefit of U.S. provisional Patent Application Ser. No. 60/340,615, filed Dec. 14, 2001, which is herein incorporated by reference.

BACKGROUND OF THE DISCLOSURE

1. Field of the Invention

The invention relates to the fabrication of integrated circuits and to a process for depositing dielectric layers on a substrate and the structures formed by the dielectric layers.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional CVD processes supply reactive gases to the substrate surface where heat-induced or energy-enhanced chemical reactions take place to produce a desired layer.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.18 $\mu$m feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to reduce the capacitive coupling between adjacent metal lines. One such low k material comprises silicon, oxygen, and carbon, and may be deposited as a dielectric material in fabricating damascene features. One conductive material having a low resistivity is copper and its alloys, which have become the materials of choice for sub-quarter-micron interconnect technology because copper has a lower resistivity than aluminum, (1.7 $\mu\Omega$-cm compared to 3.1 $\mu\Omega$-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e., vias, and horizontal interconnects, i.e., lines. Conductive materials, such as copper and barrier layer materials used to prevent diffusion of copper into the surrounding low k dielectric are then inlaid into the etched pattern. Any excess copper and barrier layer materials external to the etched pattern, such as on the field of the substrate, are then removed.

However, low k dielectric materials are often porous and susceptible to interlayer diffusion of conductive materials, such as copper, which can result in the formation of short-circuits and device failure. A dielectric barrier layer material is used in copper damascene structures to reduce or to prevent interlayer diffusion. However, traditional dielectric barrier layer materials, such as silicon nitride, often have high dielectric constants of 7 or greater. The combination of such a high k dielectric material with surrounding low k dielectric materials results in dielectric stacks having a higher than desired dielectric constant.

Additionally, low k materials are susceptible to surface defects or feature deformation during polishing and removal of conductive materials under conventional polishing processes. One solution to limiting or reducing surface defects and deformation is to deposit a hardmask over the exposed low k materials prior to patterning and etching feature definitions in the low k materials. The hardmask is resistive to damage and deformation and protects the underlying low k materials during subsequent material deposition and planarization or material removal processes, such as chemical mechanical polishing techniques or etching techniques, to reduce defect formation and feature deformation.

One difficulty when using hardmasks is that conventional hardmask materials do not have sufficient resistivity to polishing, which may result in premature removal of the hardmask and expose the underlying material to the process. The exposed underlying material, such as the low k dielectric material, may be damaged and result in surface defects and feature deformation. Additionally, conventional hardmask materials often have high dielectric constants of 7 or greater, which can produce dielectric stacks having a higher than desired dielectric constant. Current hardmask materials have not satisfactorily produced both low k material and sufficient polishing resistivity to be used in damascene fabrication.

Therefore, there remains a need for an improved process for depositing dielectric materials with reduced or low dielectric constants as barrier layers or hardmasks with a satisfactory polishing resistivity for damascene applications.

SUMMARY OF THE INVENTION

Aspects of the invention generally provide a method for depositing an oxygen-doped silicon carbide layer having a low dielectric constant. In one aspect, the invention provides a method for processing a substrate including introducing a processing gas consisting essentially of a compound comprising oxygen and carbon, and an oxygen-free organosilicon compound to the processing chamber, and reacting the processing gas to deposit a dielectric material on the substrate, wherein the dielectric material comprises silicon, oxygen, and carbon, and has an oxygen content of about 15 atomic percent or less.

In another aspect of the invention, a method is provided for processing a substrate including depositing a barrier layer on the substrate by reacting a processing gas comprising an oxygen-containing organosilicon compound and an oxygen-free organosilicon compound, wherein the dielectric material comprises silicon, oxygen, and carbon, and has an oxygen content of about 15 atomic percent or less, and depositing an intermetal dielectric layer on the barrier layer.

In another aspect of the invention, a method is provided for processing a substrate including depositing at least one dielectric layer on a substrate surface, forming an hardmask layer on the at least one dielectric layer, wherein the hardmask layer is deposited by reacting a processing gas comprising an oxygen-containing organosilicon compound in a plasma to deposit a material containing silicon, carbon, and an oxygen content of about 15 atomic percent or less, defining a pattern in at least one region of the hardmask layer, forming a feature definition in the at least one dielectric layer by the pattern formed in the at least one region of the hardmask layer, depositing a conductive material in the feature definition, polishing the conductive material, wherein the polishing process has a removal rate ratio between the conductive material and the hardmask layer of about 4:1 or greater.

In another aspect of the invention, a method is provided for processing a substrate including depositing a barrier layer on the substrate by reacting a processing gas consisting essentially of carbon dioxide and an oxygen-free organosilicon compound, wherein the dielectric material comprises silicon, oxygen, and carbon, and has an oxygen content of about 15 atomic percent or less and depositing an intermetal dielectric layer on the barrier layer.

BRIEF DESCRIPTION OF THE DRAWINGS

So that the manner in which the above features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

For a further understanding of aspects of the invention, reference should be made to the ensuing detailed description.

DETAILED DESCRIPTION OF THE PREFERRED EMBODIMENTS

Aspects of the invention described herein refer to method for depositing an oxygen-doped silicon carbide layer. Oxygen-doped silicon carbide layers may be deposited by including at least one compound containing oxygen and carbon in a processing gas comprising at least one oxygen-free organosilicon compound. The oxygen-doped silicon carbide layer may then be treated after deposition for modifying layer properties. The oxygen-doped silicon carbide layer typically includes less than about 15 atomic percent (atomic %) of oxygen or less, preferably having between about 3 atomic % and about 10 atomic % or less of oxygen. The oxygen-doped silicon carbide layer may be used as a barrier layer adjacent a conductive material or a hardmask dielectric layer in a metallization scheme for a damascene or dual damascene process.

In one aspect, the oxygen-doped silicon carbide layer may be deposited by reacting a processing gas including an oxygen-containing organosilicon compound and an oxygen-free organosilicon compound to form a dielectric layer comprising carbon-silicon bonds and having a dielectric constant less than about 5. The oxygen-doped silicon carbide layer may be deposited by a plasma-enhanced chemical vapor deposition process.

Suitable organosilicon compounds for the processes described herein include aliphatic organosilicon compounds, cyclic organosilicon compounds, or combinations thereof. Cyclic organosilicon compounds typically have a ring comprising three or more silicon atoms and the ring may further comprise one or more oxygen atoms. Commercially available cyclic organosilicon compounds include rings having alternating silicon and oxygen atoms with one or two alkyl groups bonded to the silicon atoms.

Aliphatic organosilicon compounds have linear or branched structures comprising one or more silicon atoms and one or more carbon atoms, and the structure may further comprise oxygen. Commercially available aliphatic organosilicon compounds include oxygen-free organosilicon compounds, such as alkylsilanes and oxygen-containing organosilicon compounds, such as alkylsiloxanes.

Organosilicon compounds contain carbon atoms in organic groups. Low dielectric constant layers are prepared from organosilicon compounds that have one or more carbon atoms attached to silicon wherein the carbon is not readily removed by oxidation at suitable processing conditions. The organosilicon compounds used preferably include the structure:

Wherein R includes alkyl, alkenyl, cyclohexenyl, and aryl groups in addition to functional derivatives thereof. However, the invention contemplates the use of organosilicon precursors without Si—H bonds.

Suitable oxygen-free organosilicon compounds include, for example, one or more of the following compounds:

| | |
|---|---|
| Methylsilane, | $CH_3$—$SiH_3$ |
| Dimethylsilane, | $(CH_3)_2$—$SiH_2$ |
| Trimethylsilane (TMS), | $(CH_3)_3$—$SiH$ |
| Ethylsilane, | $CH_3$—$CH_2$—$SiH_3$ |
| Disilanomethane, | $SiH_3$—$CH_2$—$SiH_3$ |
| Bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$, and |
| 1,3,5-trisilano-2,4,6-trimethylene, | $-(SiH_2CH_2)_3-$ (cyclic). |

Suitable oxygen-containing organosilicon compounds include, for example, one or more of the following compounds:

| | |
|---|---|
| Dimethyldimethoxysilane, | $(CH_3)_2$—$Si$—$(OCH_3)_2$ |
| 1,3-dimethyldisiloxane, | $CH_3$—$SiH_2$—$O$—$SiH_2$—$CH_3$ |
| 1,1,3,3-tetramethyldisiloxane (TMDSO), | $(CH_3)_2$—$SiH$—$O$—$SiH$—$(CH_3)_2$ |
| Hexamethyldisiloxane (HMDS), | $(CH_3)_3$—$Si$—$O$—$Si$—$(CH_3)_3$ |

| -continued | |
|---|---|
| 1,3-bis(silanomethylene)disiloxane, | (SiH$_3$—CH$_2$—SiH$_2$)$_2$-O |
| Bis(1-methyldisiloxanyl)methane, | (CH$_3$—SiH$_2$—O—SiH$_2$)$_2$-CH$_2$ |
| 2,2-bis(1-methyldisiloxanyl)propane, | (CH$_3$—SiH$_2$—O—SiH$_2$)$_2$-C(CH$_3$) |
| 1,3,5,7-tetramethylcyclotetrasiloxane (TMCTS), | -(-SiHCH$_3$—O-)$_4$- (cyclic) |
| Octamethylcyclotetrasiloxane (OMCTS), | -(-Si(CH$_3$)$_2$—O-)$_4$- (cyclic) |
| 2,4,6,8,10-pentamethylcyclopentasiloxane, | -(-SiHCH$_3$—O-)$_5$- (cyclic) |
| 1,3,5,7-tetrasilano-2,6-dioxy-4,8-dimethylene, | -(-SiH$_2$—CH$_2$—SiH$_2$—O-)$_2$- (cyclic) |
| Hexamethylcyclotrisiloxane | -(-Si(CH$_3$)$_2$—O-)$_3$- (cyclic). |

The above lists are illustrative and should not be construed or interpreted as limiting the scope of the invention.

The oxygen-free organosilicon compound and an oxygen-containing organosilicon compound react to deposit an oxygen-doped silicon carbide film having about 15 atomic % or less oxygen content and a dielectric constant of less than about 5. An oxygen content between about 3 atomic % and about 10 atomic % should have sufficient barrier layer properties and exhibit a dielectric constant of about 4 or less.

The oxygen-free organosilicon compound comprises at least one silicon-carbon bond and the oxygen-containing organosilicon compound contains a silicon-oxygen bond. For example, the oxygen-free organosilicon compound may be trimethylsilane (TMS) and the oxygen-containing organosilicon compound may be 1,3,5,7-tetramethylcyclotetrasiloxane. The oxygen-free organosilicon compound and the oxygen-containing organosilicon compound are reacted at a molar ratio less than 10:1, preferably a molar ration between about 4:1 and about 1:1.

The processes described herein are preferable performed in a processing chamber adapted to chemically mechanically deposit organosilicon material while applying RF power, such as a DxZ™ chemical vapor deposition chamber, commercially available from Applied Materials, Inc., Santa Clara, Calif. Generally, the organosilicon compounds are reacted in a plasma comprising a noble gas, such as helium, argon or an inert gas, such as nitrogen (N$_2$). The deposited silicon carbide layers have dielectric constants of about 5 or less, preferably about 4 or less.

An oxygen-doped silicon carbide layer may be deposited in one embodiment by supplying organosilicon compounds, such as trimethylsilane and/or 1,3,5,7-tetramethylcyclotetrasiloxane, to a plasma processing chamber at a flow rate between about 10 milligrams/minute (mgm) and about 1500 mgm, respectively, optionally supplying an oxidizing gas at a flow rate between about 10 sccm and about 2000 sccm, supplying a noble gas at a flow rate between about 1 sccm and about 10000 sccm, maintaining a substrate temperature between about 0° C. and about 500° C., maintaining a chamber pressure below about 500 Torr and an RF power of between about 0.03 watts/cm$^2$ and about 1500 watts/cm$^2$.

The RF power can be provided at a high frequency such as between 13 MHz and 14 MHz or a mixed frequency of the high frequency and the low frequency. For example, a high frequency of about 13.56 MHz may be used as well as a mixed frequency of high frequency of about 13.56 MHz and low frequency of about 356 KHz. The RF power can be provided continuously or in short duration cycles wherein the power is on at the stated levels for cycles less than about 200 Hz and the on cycles total between about 10% and about 30% of the total duty cycle. Additionally, a low frequency RF power may be applied during the deposition process. For example, an application of less than about 300 watts, such as less than about 100 watts at between about 100 KHz and about 1 MHz, such as 356 KHz may be used to modify film properties, such as increase the compressive stress of a SiC film to reduce copper stress migration.

The processing gas may be introduced into the chamber by a gas distributor, the gas distributor may be positioned between about 200 mils and about 700 mils from the substrate surface.

In one preferred aspect, an oxygen-doped silicon carbide layer may be deposited in one embodiment by supplying organosilicon compounds, such as trimethylsilane and 1,3,5,7-tetramethylcyclotetrasiloxane, to a plasma processing chamber at a flow rate between about 100 milligrams/minute (mgm) and about 500 mgm, respectively, at a molar ratio of oxygen-free organosilicon compounds, i.e., trimethylsilane, to oxygen-containing organosilicon compounds, i.e., 1,3,5,7-tetramethylcyclotetrasiloxane, between about 4:1 and about 1:1, supplying a noble gas at a flow rate between about 500 sccm and about 2000 sccm, maintaining a substrate temperature between about 250° C. and about 450° C., maintaining a chamber pressure between about 1 Torr and about 12 Torr and an RF power of between about 500 watts and about 1000 watts for a 200 mm substrate.

The RF power can be provided at a high frequency such as between 13 MHz and 14 MHz or a mixed frequency of the high frequency and the low frequency, for example, a high frequency of about 13.56 MHz and a low frequency of about 356 KHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 300 mils and about 450 mils from the substrate surface.

In another aspect, an oxygen-containing gas is reacted with an oxygen-free organosilicon compound, such as trimethylsilane (TMS), to deposit the oxygen-doped silicon carbide material having a dielectric constant of about 5 and less. The oxygen-containing gas generally has the formula $C_XH_YO_Z$, with x being between 0 and 2, Y being between 0 and 2, where X+Y is at least 1, and Z being between 1 and 3, wherein X+Y+Z is 3 or less. Thus, the oxygen-containing gas may include carbon dioxide or water. The oxygen-containing gas is typically an inorganic material. The oxygen-containing gas and the oxygen-containing organosilicon compound described herein are considered non-oxidizing gases as compared to oxygen or ozone.

An oxygen-doped silicon carbide layer may be deposited in one embodiment by supplying oxygen-free organosilicon compounds, such as trimethylsilane, to a plasma processing chamber at a flow rate between about 10 milligrams/minute (mgm) and about 1500 mgm, supplying the oxygen containing gas at a flow rate between about 10 sccm and about 2000 sccm, at a molar ratio of oxygen-containing gas to oxygen-free organosilicon compounds between about 1:1 and about 3:1, supplying an inert gas at a flow rate between about 1 sccm and about 10000 sccm, maintaining a substrate temperature between about 0° C. and about 500° C., maintaining a chamber pressure below about 500 Torr and an RF power of between about 0.03 watts/cm$^2$ and about 1500 watts/cm$^2$.

The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 700 mils from the substrate surface. The showerhead may be positioned between about 300 mils and about 450 mils during the deposition process.

In one preferred aspect, an oxygen-doped silicon carbide layer may be deposited in one embodiment by supplying oxygen-free organosilicon compounds, such as trimethylsilane, to a plasma processing chamber at a flow rate between about 50 milligrams/minute (mgm) and about 1000 mgm, supplying carbon dioxide at a flow rate between about 50 sccm and about 1000 sccm, supplying an inert gas at a flow rate between about 100 sccm and about 2000 sccm, maintaining a substrate temperature between about 200° C. and about 450° C., maintaining a chamber pressure between 2 Torr and 10 Torr, and an RF power of between about 10 watts and about 1000 watts.

The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 700 mils from the substrate surface. The showerhead may be positioned between about 300 mils and about 450 mils during the deposition process.

An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The above process parameters provide a deposition rate for the oxygen-doped silicon carbide layer in the range of about 500 Å/min to about 20,000 Å/min, such as a range between about 100 Å/min and about 3000 Å/min, when implemented on a 200 mm (millimeter) substrate in a deposition chamber available from Applied Materials, Inc., Santa Clara, Calif.

Following deposition, the deposited dielectric material may be annealed at a temperature between about 100° C. and about 400° C. for between about 1 minute and about 60 minutes, preferably at about 30 minutes, to reduce the moisture content and increase the solidity and hardness of the dielectric material, if desired. Annealing is preferably performed after the deposition of the next layer that prevents shrinkage or deformation of the dielectric layer. Inert gases, such as argon and helium, may be added to the annealing atmosphere.

The deposited oxygen-doped silicon carbide layer may be plasma treated to remove contaminants or otherwise clean the exposed surface of the oxygen-doped silicon carbide layer prior to subsequent deposition of materials thereon. The plasma treatment may be performed in the same chamber used to deposit the silicon and carbon containing material. The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The plasma treatment may be performed between about 10 seconds and about 100 seconds. The plasma treatment is believed to clean contaminants from the exposed surface of the silicon carbide material and may be used to stabilize the layer, such that it becomes less reactive with moisture and/or oxygen under atmospheric conditions as well as the adhesion of layers formed thereover.

However, it should be noted that the respective parameters might be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma Treatment to Enhance Adhesion and to Minimize Oxidation of Carbon-Containing Layers," filed on Jun. 18, 1999, which is incorporated herein by reference to the extent not inconsistent with the disclosure and claimed aspects of the invention described herein.

A protective layer of silicon carbide can be deposited prior to the oxygen-doped silicon carbide layer to prevent side reactions between the plasma oxygen from carbon dioxide or oxygen and any exposed substrate material, such as copper. The protective layer of silicon carbide can be performed under the same conditions and precursors as the oxygen-doped silicon carbide layer deposition process in the absence of a free oxygen source, such as carbon dioxide.

An example of a pre-deposition protective layer of SiC can include supplying trimethylsilane to a plasma processing chamber at a flow rate of about 320 sccm, supplying helium at a flow rate of about 800 sccm, maintaining a substrate temperature of about 350° C., maintaining a chamber pressure of about 12 Torr, and an RF power of between about 10 watts and about 1000 watts to a layer thickness between about 50 Å and about 100 Å.

The embodiments described herein for depositing oxygen-doped silicon carbide layers are provided to illustrate the invention and the particular embodiment shown should not be used to limit the scope of the invention.

Deposition of a Barrier Layer for a Dual Damascene Structure

Figure 1:
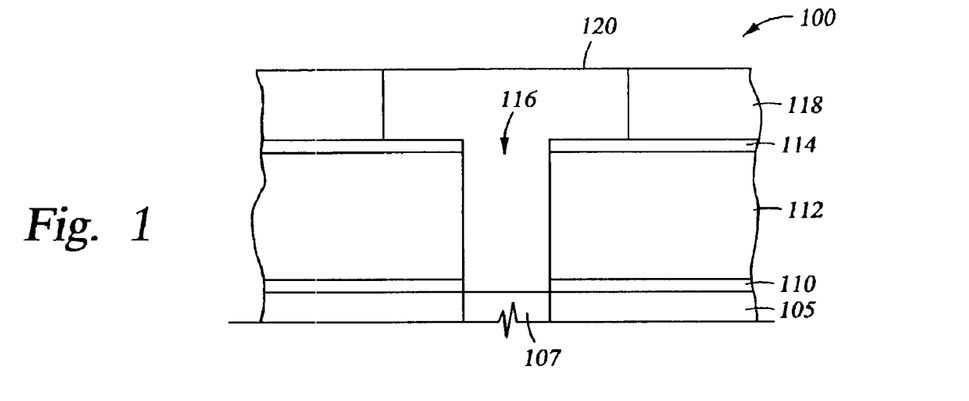
FIG. 1 is a cross sectional view showing a dual damascene structure comprising a low k barrier layer and a low k dielectric layer described herein.

An example of a damascene structure that is formed using the oxygen-doped silicon carbide material described herein as a barrier layer is shown in FIG. 1. An oxygen-doped silicon carbide barrier layer 110 is generally deposited using an oxygen-free organosilicon compound and an oxygen-containing organosilicon compound according to the processes described herein on the substrate surface to reduce or minimize interlayer diffusion of material. The substrate surface may comprise metal features 107 formed in a dielectric material 105.

A first dielectric layer 112, typically an interlayer dielectric material, such as a silicon oxycarbide material (carbon doped silicon oxide) produced by oxidizing an alkylsilane in a RF energy-enhanced chemical vapor deposition process, is deposited on the oxygen-doped silicon carbide barrier layer 110 on the substrate surface including metal features 107 formed in a dielectric material 105. An example of the dielectric material for the first dielectric layer 112 and process for deposition the dielectric material is more fully described in U.S. Pat. No. 6,287,990, issued on Sep. 11, 2001, which is incorporated by reference herein to the extent not inconsistent with the description and claims herein.

An etch stop (or second barrier layer) 114 of a silicon carbide material is then deposited on the first dielectric layer 112. The etch stop 114 may be a nitrogen containing silicon carbide material. The etch stop 114 is then pattern etched to define the openings of the interconnects or contacts/vias 116 for the first dielectric layer 112. A second dielectric layer 118 is then deposited over the patterned etch stop. A photoresist is then deposited and patterned by conventional means known in the art to define the contacts/via 116. A single etch process is then performed to define the contact/vias 116 down to the etch stop and to etch the unprotected dielectric exposed by the patterned etch stop to define the contacts/vias 116. One or more conductive materials 120 such as copper are then deposited to fill the formed contacts/vias 116.

A preferred dual damascene structure fabricated in accordance with the invention including an oxygen-doped silicon carbide barrier layer deposited by the processes described herein is sequentially depicted schematically in FIGS. 2A–2H, which are cross sectional views of a substrate having the steps of the invention formed thereon.

Figure 2A:
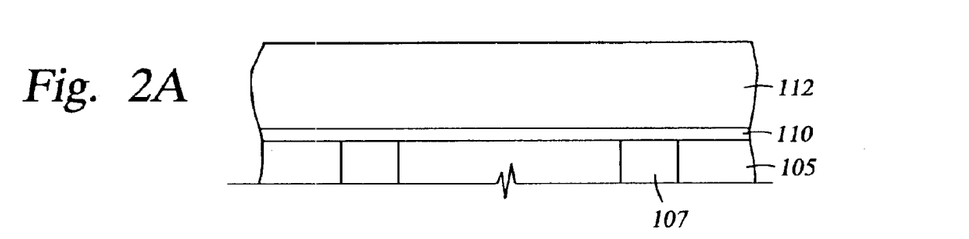
FIGS. 2A–2H are cross sectional views showing one embodiment of a dual damascene deposition sequence of the invention.

As shown in FIG. 2A, the oxygen-doped silicon carbide barrier layer 110 is deposited on the substrate surface. The oxygen-doped silicon carbide barrier layer 110 may be hypothetically deposited by a process including introducing 1,3,5,7-tetramethylcyclotetrasiloxane (TMCTS) at about 300 mgm into the processing chamber, introducing trimethylsilane (TMS) at about 360 mgm into the processing chamber, introducing helium at about 1000 sccm into the processing chamber, generating a plasma in the processing chamber by applying 950 watts of RF energy, maintaining the substrate temperature at about 350° C., maintaining the chamber pressure at about between about 8.7 Torr to deposit an oxygen-doped silicon carbide layer having an oxygen content less than about 15 atomic %. The spacing between the gas distributor and the substrate surface is about 515 mils.

While not shown, a capping layer of nitrogen free silicon carbide may be deposited on the barrier layer 110. The nitrogen free silicon carbide capping layer may be deposited in situ by the nitrogen doped silicon carbide process with the source of nitrogen minimized or eliminated during the deposition process.

The oxygen-doped silicon carbide barrier layer 110 may be plasma treated with an inert gas including helium (He), argon (Ar), neon (Ne), and combinations thereof, and/or a reducing gas including hydrogen, ammonia, and combinations thereof. The plasma treatment may be performed in situ with the deposition of the oxygen-doped silicon carbide material.

A first dielectric layer 112 of interlayer dielectric material, such as a silicon oxycarbide from an oxidized organosilane or organosiloxane, such as trimethylsilane, is deposited on the first oxygen-doped silicon carbide barrier layer 110 to a thickness of about 5,000 to about 15,000 Å, depending on the size of the structure to be fabricated. Example of a low dielectric constant material that may be used as an interlayer dielectric material is Black Diamond™ and Silk™ commercially available from Applied Materials, Inc., of Santa Clara, Calif. The first dielectric layer may also comprise other low k dielectric materials including a low polymer material, such as paralyne, or a low k spin-on glass such as un-doped silicon glass (USG) or fluorine-doped silicon glass (FSG).

The first dielectric layer 112 may then be treated by a plasma process including helium or a reducing gas, such as hydrogen, at a power level of between about 600 watts and about 800 watts for between about 40 seconds and about 60 seconds for a 200 millimeter substrate. The processing chamber is maintained at a pressure of about 20 Torr or less and at a substrate temperature of about 450° C. or less during the reactive clean process.

Figure 2B:
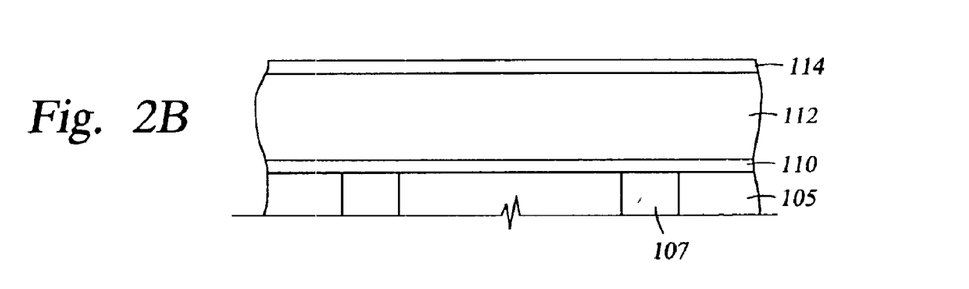
Figure 2C:
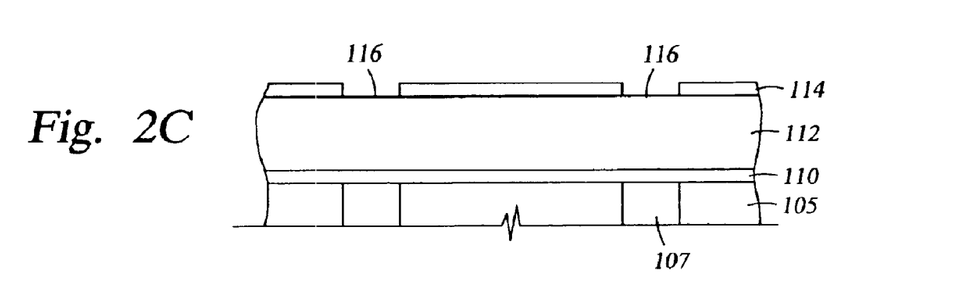

As shown in FIG. 2B, the low k etch stop 114, which may be a silicon carbide material is then deposited on the first dielectric layer to a thickness of about 200 to about 1000 Å. The low k etch stop 114 may be plasma treated as described herein for the oxygen-doped silicon carbide barrier layer 110. The low k etch stop 114 is then pattern etched to define the contact/via openings 116 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 116 prior to depositing further materials.

Figure 2D:
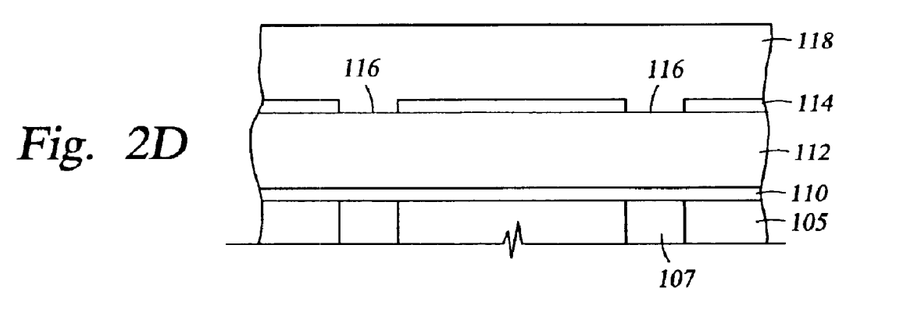

After low k etch stop 114 has been etched to pattern the contacts/vias and the photoresist has been removed, a second dielectric layer 118 of silicon oxycarbide is deposited to a thickness of about 5,000 to about 15,000 Å as shown in FIG. 2D. The second dielectric layer 118 may be plasma treated with helium or a reducing gas, such as hydrogen, at a power level of between about 600 watts and about 800 watts for between about 40 seconds and about 60 seconds for a 200 millimeter substrate. The processing chamber is maintained at a pressure of about 20 Torr or less and at a substrate temperature of about 450° C. or less during the reactive clean process. The plasma treatment is believed to reduce the reactivity of the surface of the layer 118 to subsequently deposited materials.

In an alternative embodiment, a nitrogen-free silicon carbide or silicon oxide cap layer between about 100 Å and about 500 Å thick may be deposited on second dielectric layer 118 prior to depositing additional materials, such as photoresist materials.

Figure 2E:
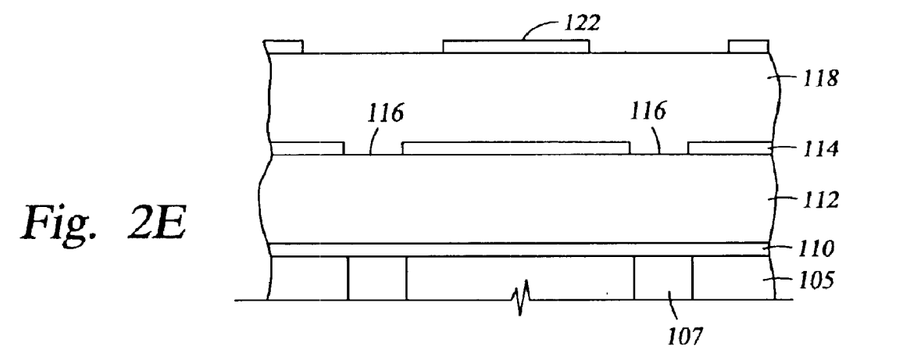
Figure 2F:
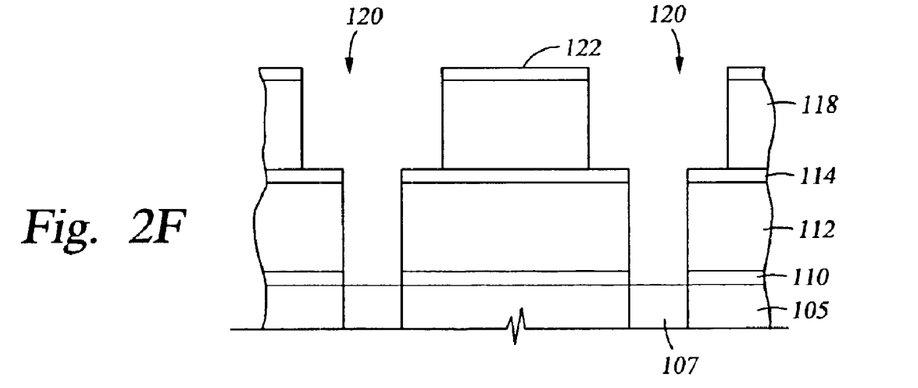

A photoresist material 122 is then deposited on the second dielectric layer 118 and patterned preferably using conventional photolithography processes to define the interconnect lines 120 as shown in FIG. 2E. The photoresist material 122 comprises a material conventionally known in the art, preferably a high activation energy photoresist, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 2F. Any photoresist or other material used to pattern the etch stop 114 or the second dielectric layer 118 is removed using an oxygen strip or other suitable process.

Figure 2G:
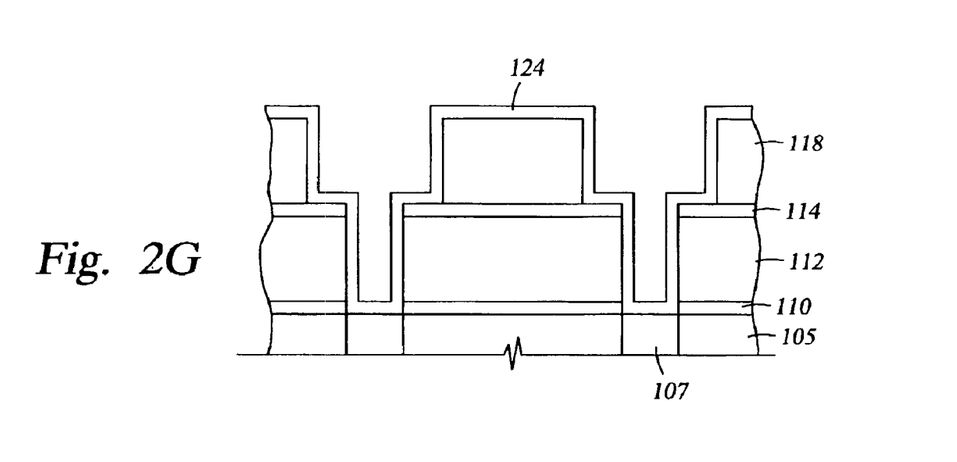
Figure 2H:
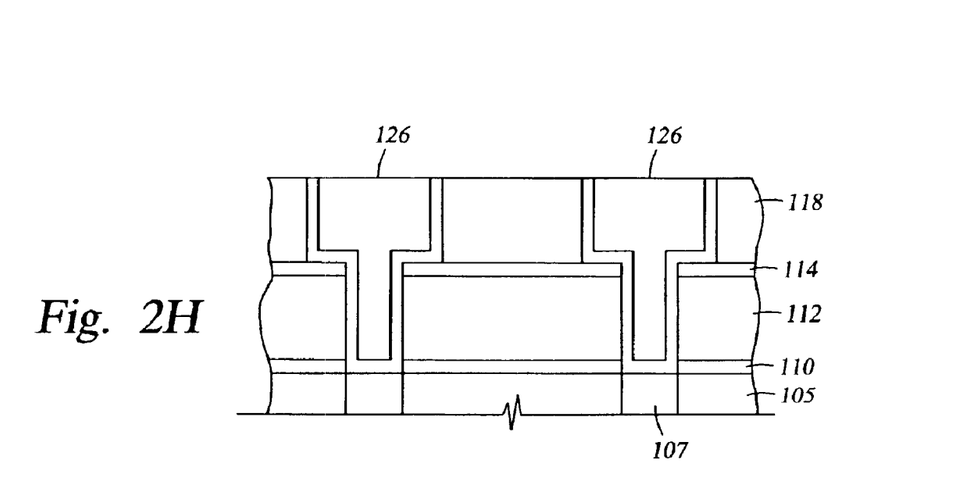

The metallization structure is then formed with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 2G, a suitable barrier layer 124 such as tantalum nitride is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 2H.

Deposition of a Dual Damascene Structure

In an alternative embodiment of the damascene structure, the oxygen-doped silicon carbide material described herein may be deposited as a hardmask layer over a dielectric layer prior to depositing the photoresist material for improving damascene formation and protecting the k material of the damascene structure when etching the metallization structure. An example of a damascene structure that is formed using an oxygen doped silicon carbide film as a hardmask the silicon carbide described herein is shown in FIGS. 3A–G, which are cross sectional views of a substrate having the steps of the invention formed thereon.

Figure 3A:
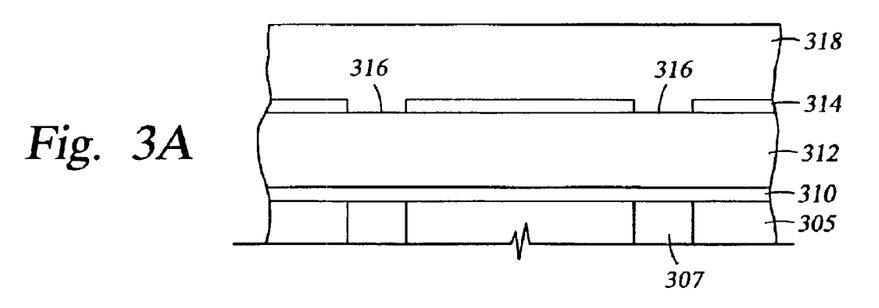
FIGS. 3A–3G are cross sectional views showing one embodiment of a dual damascene deposition sequence of the invention.

As shown in FIG. 3A, a silicon carbide barrier layer 310 is deposited on the substrate surface to eliminate inter-level diffusion between the substrate and subsequently deposited material. The substrate surface may comprise metal features 307 formed in a dielectric material 305. The silicon carbide barrier layer 310 may be doped with oxygen, boron, phosphorus, or combinations thereof.

A first dielectric layer 312, comprising silicon, oxygen, and carbon, as described herein is deposited on the silicon carbide barrier layer 310 on the substrate surface including metal features 307 formed in a dielectric material 305. The first dielectric layer 312 of interlayer dielectric material is deposited on the first silicon carbide barrier layer 310 by oxidizing an organosilane or organosiloxane, such as trimethylsilane, to a thickness of about 5,000 to about 15,000 Å, depending on the size of the structure to be fabricated.

Examples of a low dielectric constant material that may be used as an interlayer dielectric material is Black Diamond™ and Silk™ commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG). A plasma process following deposition as described herein for the silicon oxycarbide layer may then treat the first dielectric layer 312.

A low k etch stop (or second barrier layer) 314 of a silicon carbide material or oxidized organo silane layer is then deposited on the first dielectric layer 312 to a thickness of about 200 to about 1000 Å. Alternatively, the etch stop 314 may be a nitrogen containing silicon carbide material. The low k etch stop 314 is then pattern etched to define the contact/via openings 316 and to expose first dielectric layer 312 in the areas where the contacts/vias are to be formed as shown in FIG. 3A. Preferably, the low k etch stop 314 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 316 prior to depositing further materials.

After the low k etch stop 314 has been etched to pattern the contacts/vias for the first dielectric layer 312 and the photoresist has been removed, a second dielectric layer 318 of silicon oxycarbide as described herein is deposited to a thickness of about 5,000 to about 15,000 Å as shown in FIG. 3A. The second dielectric layer 318 may also be plasma treated as described herein for the silicon oxycarbide layer.

In an alternative embodiment, a nitrogen-free silicon carbide or silicon oxide cap layer between about 100 Å and about 500 Å thick may be deposited on second dielectric layer 318 prior to depositing additional materials, such as photoresist materials. In a further alternative embodiment, a silicon carbide cap layer (not shown) may be deposited on the second dielectric layer 318 prior to depositing additional materials, such as photoresist materials.

Figure 3B:
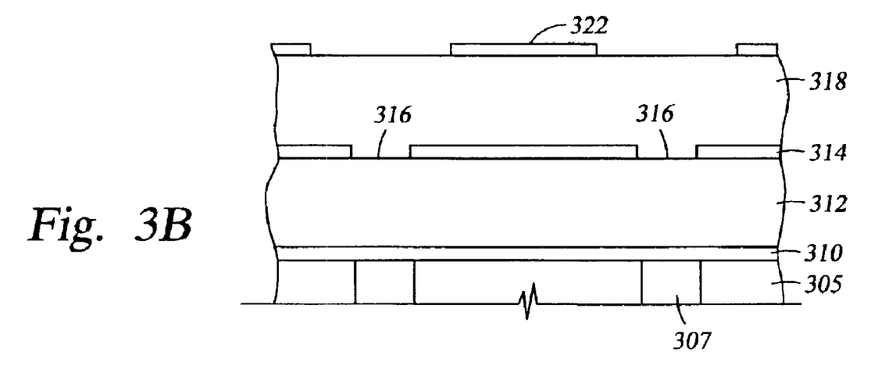

An oxygen doped silicon carbide hardmask layer 322 is then deposited on the second dielectric layer 318 (or cap layer) and patterned preferably using conventional photolithography processes to define the interconnect lines 320 as shown in FIG. 3B. The oxygen doped silicon carbide hardmask layer 322 is a hardmask which may perform as a stop for chemical mechanical polishing techniques to allow removal of conductive material while protecting low k dielectric materials, such as the second dielectric layer 318, from damage during etching or from polishing methods.

The oxygen-doped silicon carbide hardmask has a hardness of greater than 1 gPa, for example, greater than about 1.5 gPa. Generally, the silicon oxycarbide hardmask has a porosity of less than about 2% to prevent oxidative diffusion and moisture diffusion into the underlying dielectric layer. The hardness of the silicon oxycarbide hardmask allows the hardmask to serve as a polishing stop during chemical mechanical polishing (CMP). CMP does not remove the hardmask, and thus, the hardmask protects underlying layers from overpolishing. The hardmask layer 322 has exhibited a polishing selectivity, i.e., a removal rate ratio, of oxide to oxygen-doped silicon carbide of about 4:1 or greater, such as 4.6:1, and in some instances, has exhibited a polishing selectivity of about 6:1 or greater between oxide to oxygen-doped silicon carbide.

The oxygen doped silicon carbide hardmask layer 322 is deposited as described herein. An example of a hardmask deposition for silicon carbide includes introducing 1,3,5,7-tetramethylcyclotetrasiloxane (TMCTS) at about 1000 mgm into the processing chamber, introducing helium at about 500 sccm into the processing chamber, generating a plasma in the processing chamber by applying 335 watts of RF energy, maintaining the substrate temperature at about 350° C., maintaining the chamber pressure at about between about 4 Torr to deposit an oxygen-doped silicon carbide layer having an oxygen content less than about 15 atomic %. The spacing between the gas distributor and the substrate surface is about 300 mils. The hardmask has a deposition rate of about 2115 Å/min, a dielectric constant of about 3.2 and a polish selectivity of oxide to oxygen-doped silicon carbide of about 4.6:1.

Figure 3C:
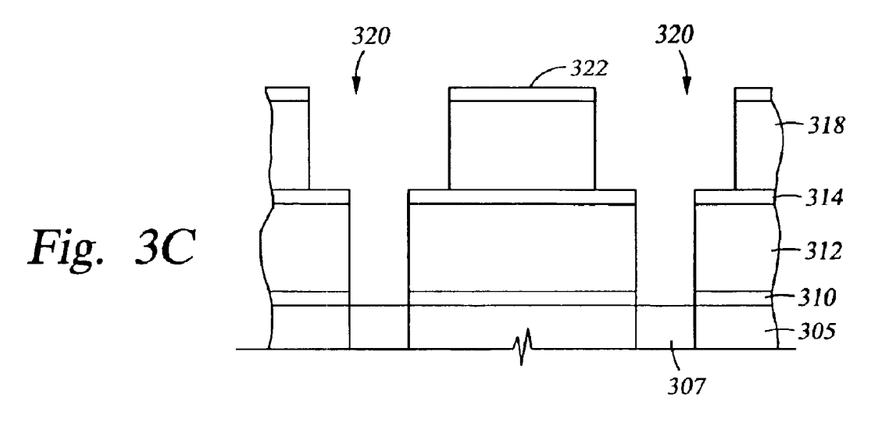
Figure 3D:
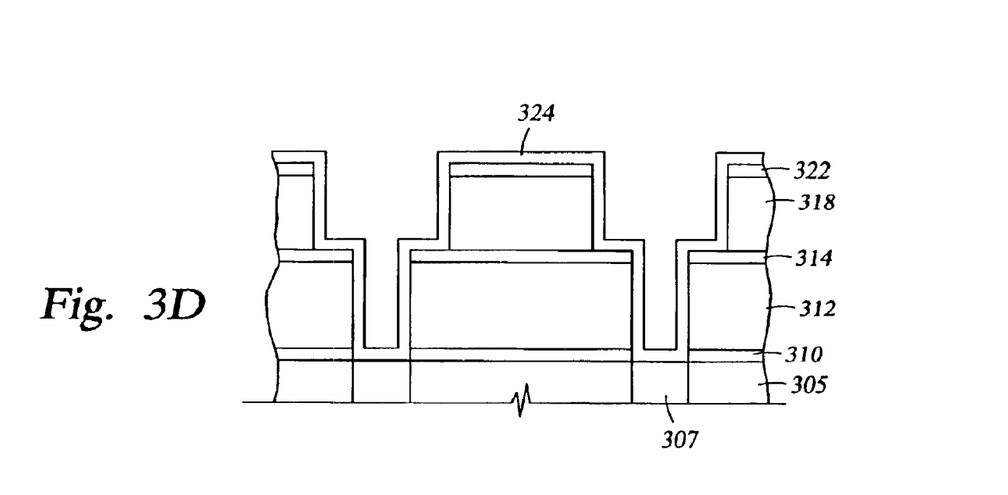
Figure 3E:
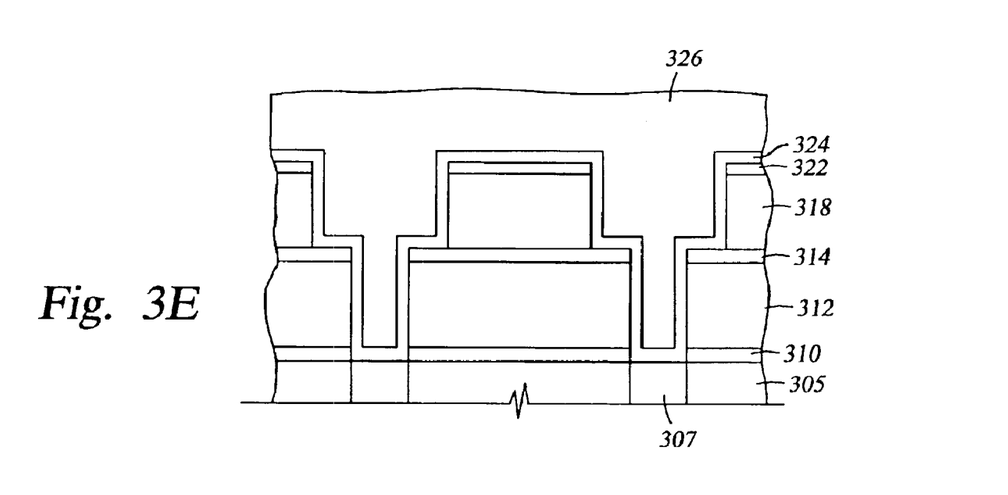

The features are then etched through to the second dielectric layer 318, the low k etch stop 314, the first dielectric layer 312, and the silicon carbide barrier layer 310 as shown in FIG. 3C. The interconnect lines 320 are filled to form a metallization structure with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 3D, a suitable barrier layer 324 such as tantalum or tantalum nitride is first deposited conformally in the metallization pattern to prevent copper migration into the surrounding silicon and/or dielectric material. Thereafter, copper 326 is deposited using either chemical vapor deposition, physical vapor deposition, electroplating, or combinations thereof to fill the structure as shown in FIG. 3E.

Figure 3F:
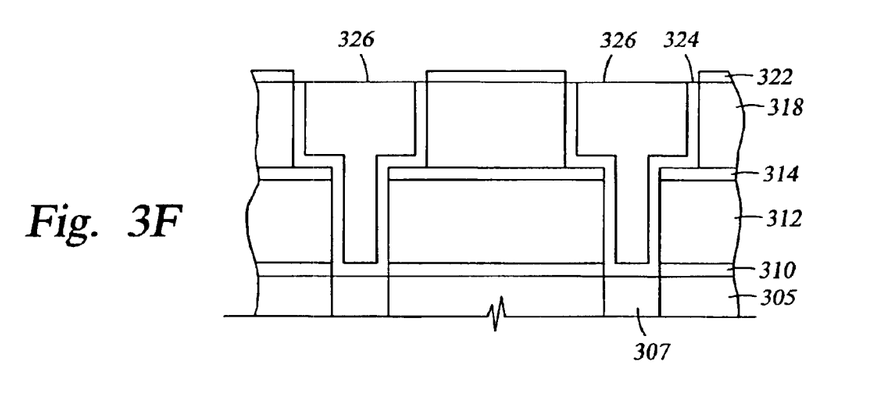
Figure 3G:
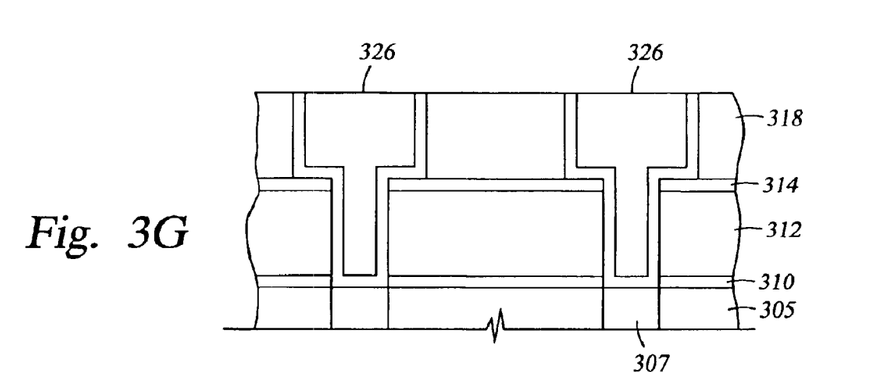

Once the structure has been filled with copper or other metal, the surface is planarized using chemical mechanical polishing. However, the polishing resistant oxygen doped silicon carbide hardmask layer 322 may remain behind after the polishing process as shown in FIG. 3F. The oxygen doped silicon carbide hardmask layer 322 may be removed by a plasma process from the surface of the substrate.

EXAMPLES

Organosilicon compounds described herein were deposited as barrier layers on substrate surface and analyzed. In one example, a silicon carbide film was deposited from a mixed precursor processing gas containing an oxygen-containing organosilicon precursor and an oxygen-free organosilicon compound and compared to a silicon carbide film from a conventional silicon carbide precursor, trimethylsilane.

An oxygen-doped silicon carbide barrier layer was deposited by a mixed precursor process including introducing 1,3,5,7-tetramethylcyclotetrasiloxane (TMCTS) at about 300 mgm into the processing chamber, introducing trimethylsiloxane (TMS) at about 360 mgm into the processing chamber, introducing helium at about 1000 sccm into the processing chamber, generating a plasma in the processing chamber by applying 950 watts of RF energy, maintaining the substrate temperature at about 350° C., maintaining the chamber pressure at about between about 8.7 Torr to deposit an oxygen-doped silicon carbide layer. The spacing between the gas distributor and the substrate surface is about 515 mils.

The deposited films were examined and analyzed for dielectric constant and barrier layer diffusion. The mixed precursor processing gas silicon carbide film had a measured dielectric constant of about 4 and the trimethylsilane silicon carbide film had a measured dielectric constant of about 4.3.

The barrier layer properties were tested by a Bias Temperature test, which was performed by forming a damascene device using the above described silicon carbide films and subjecting the deposited films to a substrate temperature of about 275° C. while measuring leakage current for a device. Leakage current increases with degrading barrier layer properties. When leakage current reaches about $10^{-3}$ amps/cm$^2$, the barrier layer is considered to have failed. When 50% of the devices failed under these processing conditions, the time was measured to indicate barrier effectiveness for the deposited films. Comparison of the films indicated that the mixed precursor silicon carbide had a leakage current of about $1.25e^{-09}$ amps/cm$^2$ at 1 mega volts/cm (MV/cm) and about $1.98e^{-8}$ amps/cm$^2$ at 2 MV/cm and had a 50% failure rate after about 3.7 hours while the trimethylsilane silicon carbide film had a leakage current of about $1e^{-09}$ amps/cm$^2$ at 1 MV/cm and about $1e^{-6}$ amps/cm$^2$ at 2 MV/cm and had a 50% failure rate after about 4.4 hours.

A oxygen-doped silicon carbide barrier layer was deposited by reacting carbon dioxide and trimethylsilane (TMS), the process including introducing carbon dioxide at about 320 sccm into the processing chamber, introducing trimethylsilane (TMS) at about 320 mgm into the processing chamber, introducing helium at about 1000 sccm into the processing chamber, generating a plasma in the processing chamber by applying 460 watts of RF energy, maintaining the substrate temperature at about 350° C., maintaining the chamber pressure at about 2.5 Torr to deposit an oxygen-doped silicon carbide layer. The spacing between the gas distributor and the substrate surface is about 400 mils. This process provided a deposition rate of about 1244 Å/min.

In order to prevent initial the oxygen-containing plasma, for example the CO$_2$, from oxidizing exposed portion of the substrate surface, a pre-deposition protective layer of SiC was deposited by supplying trimethylsilane to a plasma processing chamber at a flow rate of about 320 sccm, supplying helium at a flow rate of about 800 sccm, maintaining a substrate temperature of about 350° C., maintaining a chamber pressure of about 12 Torr, and an RF power of between about 10 watts and about 1000 watts to a layer thickness between about 50 Å and about 100 Å.

The deposited films were examined and analyzed for dielectric constant and barrier layer diffusion. The carbon dioxide deposited silicon carbide film had a measured dielectric constant of about 4.2 and the trimethylsilane silicon carbide film had a measured dielectric constant of about 4.3. The deposited silicon carbide film also has a reflective index of 1.9128 and a compressive stress level of $1.27E^9$ dynes/cm$^2$.

Additionally, the stress of the SiC barrier was observed to be controllable or "tuned" by the application of low frequency RF during the deposition process. For example, an application of 25 watts at 356 KHz was observed to increase the compressive stress of a SiC film from about 1.6 $E^9$ dynes/cm$^2$ to about 2.2E$^9$ dynes/cm$^2$, which is desirable to reduce copper stress migration.

The barrier layer properties were tested by a Bias Temperature test, which was performed by forming a damascene device using the above described silicon carbide films and subjecting the deposited films to a substrate temperature of about 275° C. while measuring leakage current for a device. Leakage current increases with degrading barrier layer properties. When leakage current reaches about $10^{-3}$ amps/cm$^2$, the barrier layer is considered to have failed. When 50% of the devices failed under these processing conditions, the time was measured to indicate barrier effectiveness for the deposited films. Comparison of the films indicated that the mixed precursor silicon carbide had a leakage current of about $8e^{-10}$ amps/cm$^2$ at 1 mega volts/cm (MV/cm) and about $4e^{-8}$ amps/cm$^2$ at 2 MV/cm and had a 50% failure rate after more than about 10 hours, for example, one substrate had a failure at about 18 hours, while the trimethylsilane silicon carbide film had a leakage current of about $1e^{-09}$ amps/cm$^2$ at 1 MV/cm and about $1e^{-6}$ amps/cm$^2$ at 2 MV/cm and had a 50% failure rate after about 4.4 hours.

This data indicates a significant and unexpected improvement in barrier layer properties and dielectric constant for mixed precursor processing gas in comparison to available barrier layer processes.

Additionally, the oxygen-doped silicon carbide barrier layer deposited by reacting carbon dioxide and trimethylsilane (TMS) described above and an oxygen-doped silicon carbide barrier layer deposited by reacting oxygen (O$_2$) under similar processing conditions as the examples were compared. The carbon dioxide and TMS layer was deposited at a rate between about 1000 Å/min and about 2000 Å/min and the layer properties were observed to be: a dielectric constant between about 3.8 and about 4.8, with an average of about 4.2, a hardness between about 1.5 GPa and about 3 GPa, and a compressive stress of about 1.6e$^9$ dynes/cm$^2$. The oxygen and TMS layer was deposited at a rate of about 6000 Å/min or greater and the layer properties were observed to be: a dielectric constant between about 2.7 and about 3.48, with an average of about 2.8, a hardness between about 1.5 GPa and about 3 GPa, and a tensile stress of about 5e$^8$ dynes/cm$^2$. Minimal or reduced damage to underlying low k materials was observed for the carbon monoxide and TMS layer compared to the oxygen and TMS layer.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising:
   depositing a first barrier layer by a process comprising:
   introducing a processing gas consisting essentially carbon dioxide, an inert gas, and an oxygen-free organosilicon compound to the processing chamber; and reacting the processing gas to deposit an oxygen-doped silicon carbide on a surface of the substrate, wherein the oxygen-doped silicon carbide has an oxygen content of about 15 atomic percent or less;

depositing a first dielectric layer on the first barrier layer;

depositing a second barrier layer on the first dielectric layer; and then etching feature definitions in the second barrier layer to expose the first dielectric layer.

2. The method of claim 1, wherein the oxygen-free organosilicon compound comprises an organosilane compound selected from the group of methylsilane, dimethylsilane, trimethylsilane, ethylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, and combinations thereof.

3. The method of claim 1, further comprising depositing a second dielectric layer on the second barrier layer.

4. The method of claim 1, further comprising:
depositing a photoresist material on the second dielectric layer;
patterning the photoresist layer;
etching the second dielectric layer, the first dielectric layer, and the first barrier layer to define an interconnect feature definition therethrough; and
depositing one or more conductive materials to fill the interconnect opening.

5. The method of claim 1, wherein the oxygen-doped silicon carbide has an oxygen content between about 3 atomic % and about 10 atomic % of oxygen.

6. The method of claim 1, wherein the inert gas selected is from the group of argon, helium, neon, xenon, or krypton, and combinations thereof.

7. The method of claim 1, wherein the second barrier layer is deposited by a process comprising:
introducing a processing gas consisting essentially carbon dioxide, an inert gas, and an oxygen-free organosilicon compound to the processing chamber; and
reacting the processing gas to deposit an oxygen-doped silicon carbide on the substrate, wherein the oxygen-doped silicon carbide comprises silicon, oxygen, and carbon, and has an oxygen content of about 15 atomic percent or less.

8. The method of claim 1, wherein reacting the processing gas comprises generating a plasma by applying a power density between about 0.03 watts/cm$^2$ and about 1500 watts/cm$^2$.

9. The method of claim 1, wherein the oxygen-free organosilicon precursor comprises Si—H bonds.

10. The method of claim 1, wherein the reacting the processing gas to deposit the oxygen-doped silicon carbide comprises supplying trimethylsilane to a plasma processing chamber at a flow rate between about 50 milligrams/minute (mgm) and about 1000 mgm, supplying carbon dioxide at a flow rate between about 50 milligrams/minute (mgm) and about 1000 mgm, supplying helium at a flow rate between about 100 sccm and about 2000 sccm, maintaining a substrate temperature between about 200° C. and about 450° C., maintaining a chamber pressure between 2 Torr and 10 Torr, and an RF power of between about 10 watts and about 1000 watts.

11. The method of claim 1, further comprising exposing the oxygen-doped silicon carbide to an annealing process, a plasma treatment process or both.

12. The method of claim 1, further comprising depositing a silicon carbide cap layer on the substrate surface prior to deposition of the oxygen-doped silicon carbide.

13. The method of claim 1, wherein the oxygen-free organosilicon compound is trimethylsilane and the inert gas is helium.

14. The method of claim 1, wherein substrate surface comprises a dielectric material, a metal material, or combinations thereof.

15. The method of claim 1, wherein the metal material comprises copper.

16. A method for processing a substrate, comprising:
depositing at least one dielectric layer on a substrate surface;
forming an hardmask layer having an oxygen content of about 15 atomic percent or less on the at least one dielectric layer, wherein the hardmask layer is deposited by a process comprising:
introducing a processing gas consisting essentially carbon dioxide, an inert gas, and an oxygen-free organosilicon compound to a processing chamber; and
reacting the processing gas in a plasma to deposit an oxygen-doped silicon carbide material;
defining a pattern in at least one region of the hardmask layer;
forming a feature definition in the at least one dielectric layer by the pattern formed in the at least one region of the hardmask layer;
depositing a conductive material in the feature definition;
polishing the conductive material, wherein the polishing process has a removal rate ratio between the conductive material and the hardmask layer of about 4:1 or greater.

17. The method of claim 16, wherein at least one of the at least one dielectric layers comprises silicon, oxygen, and carbon and has a dielectric constant of about 3 or less.

18. The method of claim 16, wherein the at least one dielectric layer comprises depositing a first barrier layer by a process comprising:
introducing a processing gas consisting essentially carbon dioxide, an inert gas, and an oxygen-free organosilicon compound to the processing chamber; and
reacting the processing gas to deposit an oxygen-doped silicon carbide on a surface of the substrate, wherein the oxygen-doped silicon carbide has an oxygen content of about 15 atomic percent or less;
depositing a first dielectric layer on the first barrier layer; and
depositing a second barrier layer on the first dielectric layer.

19. The method of claim 16, wherein the removal rate ratio between the conductive material and the hardmask layer is greater than about 4.5:1.

20. The method of claim 17, wherein the removal rate ratio between the at least one dielectric layer and the hardmask layer is greater than about 6:1.

21. The method of claim 16, wherein the oxygen-free organosilicon compound comprises an organosilane compound selected from the group of methylsilane, dimethylsilane, trimethylsilane, ethylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, and combinations thereof.

22. The method of claim 16, further comprising exposing the oxygen-doped silicon carbide to an annealing process, a plasma treatment process or both.

23. The method of claim 16, wherein the oxygen-free organosilicon compound is trimethylsilane and the inert gas is helium.

24. The method of claim 16, wherein the hardmask layer has an oxygen content between about 3 atomic % and about 10 atomic %.

25. The method of claim 16, wherein the inert gas is selected from the group of argon, helium, neon, xenon, or krypton, and combinations thereof.

26. The method of claim 16, wherein the reacting the processing gas to deposit an oxygen-doped silicon carbide comprises supplying trimethylsilane to a plasma processing chamber at a flow rate between about 50 milligrams/minute (mgm) and about 1000 mgm, supplying carbon dioxide at a flow rate between about 50 milligrams/minute (mgm) and about 1000 mgm, supplying helium at a flow rate between about 100 sccm and about 2000 sccm, maintaining a substrate temperature between about 200° C. and about 450° C., maintaining a chamber pressure between 2 Torr and 10 Torr and an RF power of between about 10 watts and about 1000 watts.

27. The method of claim 16, wherein reacting the processing gas comprises generating a plasma by applying a power density between about 0.03 watts/cm$^2$ and about 1500 watts/cm$^2$.

* * * * *

UNITED STATES PATENT AND TRADEMARK OFFICE
CERTIFICATE OF CORRECTION

PATENT NO. : 6,890,850 B2
APPLICATION NO. : 10/196498
DATED : May 10, 2005
INVENTOR(S) : Ju-Hyung Lee et al.

It is certified that error appears in the above-identified patent and that said Letters Patent is hereby corrected as shown below:

In the Specification

Column 4, Line 66: Change "$(CH_3)_2-Si-O-Si-(CH_3)_3$" to --$(CH_3)_3-Si-O-Si-(CH_3)_3$--

Signed and Sealed this

Twenty-second Day of August, 2006

JON W. DUDAS
*Director of the United States Patent and Trademark Office*